United States Patent
Yeh et al.

(10) Patent No.: US 11,630,002 B2
(45) Date of Patent: Apr. 18, 2023

(54) METHOD FOR SENSING TEMPERATURE IN MEMORY DIE, MEMORY DIE AND MEMORY WITH TEMPERATURE SENSING FUNCTION

(71) Applicant: MACRONIX International Co., Ltd., Hsinchu (TW)

(72) Inventors: Yuchih Yeh, Hsinchu (TW); Jianshing Liu, Hsinchu (TW); Chin Chu Chung, Hsinchu (TW); Nai-Ping Kuo, Hsinchu (TW); Shihchou Juan, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 160 days.

(21) Appl. No.: 17/169,939

(22) Filed: Feb. 8, 2021

(65) Prior Publication Data

US 2022/0252460 A1    Aug. 11, 2022

(51) Int. Cl.
   *G01K 3/00* (2006.01)
   *G06F 13/16* (2006.01)
   *G11C 16/04* (2006.01)

(52) U.S. Cl.
   CPC ......... *G01K 3/005* (2013.01); *G06F 13/1668* (2013.01); *G11C 16/0483* (2013.01)

(58) Field of Classification Search
   CPC . G01K 3/005; G06F 13/1668; G11C 16/0483; G11C 7/04; G11C 16/3418
   See application file for complete search history.

(56) References Cited

U.S. PATENT DOCUMENTS

| | | | | |
|---|---|---|---|---|
| 4,473,762 | A * | 9/1984 | Iwahashi | G05D 23/1906 327/288 |
| 10,395,754 | B2 * | 8/2019 | Maffeis | H03M 13/3723 |
| 10,509,132 | B1 * | 12/2019 | Ray | G01T 1/026 |
| 2005/0104176 | A1 * | 5/2005 | Rodney | H01L 27/12 257/E27.111 |
| 2007/0211548 | A1 | 9/2007 | Jain et al. | |
| 2010/0293305 | A1 * | 11/2010 | Park | G11C 7/04 711/170 |
| 2014/0009124 | A1 * | 1/2014 | Skinner | H02H 9/004 320/166 |
| 2015/0043266 | A1 * | 2/2015 | Youn | G11C 13/0021 365/148 |

(Continued)

OTHER PUBLICATIONS

"Office Action of Taiwan Counterpart Application", dated Oct. 18, 2021, p. 1-p. 7.

*Primary Examiner* — Mohammad K Islam
(74) *Attorney, Agent, or Firm* — J.C. Patents

(57) ABSTRACT

A method for sensing temperature in memory die, memory die and memory with temperature sensing function are provides. The memory die includes at least one temperature monitoring for outputting a temperature status in the memory die; a temperature sensor, arranged in the memory die for sensing an operation temperature in the memory die; and a control logic unit, coupled to the temperature sensor for receiving the operation temperature and coupled to the temperature monitoring pin. The control logic unit compares the operation temperature and a threshold value received from outside of the memory die to generate a comparison result, and outputs the temperature status through the temperature monitoring according to the comparison result.

23 Claims, 6 Drawing Sheets

(56) References Cited

U.S. PATENT DOCUMENTS

| | | | |
|---|---|---|---|
| 2015/0094875 A1* | 4/2015 | Duzly | G06F 13/1668 |
| | | | 700/300 |
| 2015/0301932 A1* | 10/2015 | Oh | G06F 13/00 |
| | | | 711/102 |
| 2016/0054183 A1* | 2/2016 | Yayama | G01K 15/005 |
| | | | 374/1 |
| 2016/0334992 A1* | 11/2016 | Yashiro | G11C 7/04 |
| 2019/0311770 A1* | 10/2019 | Gupta | G11C 11/5635 |
| 2020/0066345 A1* | 2/2020 | Tran | G06F 17/16 |
| 2020/0213468 A1* | 7/2020 | Ito | H04N 1/32358 |
| 2021/0303214 A1* | 9/2021 | Nakano | G06F 11/1068 |
| 2021/0303432 A1* | 9/2021 | Chang | G06F 11/3037 |
| 2022/0012141 A1* | 1/2022 | Kim | G06F 1/3221 |
| 2022/0019375 A1* | 1/2022 | Zhou | G06F 3/0605 |
| 2022/0100427 A1* | 3/2022 | Boehm | G06F 3/0659 |
| 2022/0155994 A1* | 5/2022 | Shim | G06F 3/0614 |

\* cited by examiner

METHOD FOR SENSING TEMPERATURE IN MEMORY DIE, MEMORY DIE AND MEMORY WITH TEMPERATURE SENSING FUNCTION

BACKGROUND

Technical Field

The present disclosure relates to a method for sensing temperature in a memory die, a memory die and a memory with temperature sensing function.

Description of Related Art

The operation temperature of memory, such as flash memory, will increase with the operations of the system and the flash memory. High temperature will result in certain impacts to the flash memory, for example, the functionality and the lifetime of the flash memory are affected. As the temperature of the flash memory increases, the function of the flash memory may malfunction, leading the flash memory unable to operate normally.

In addition, the data retention of the flash memory also depends on the ability to determine the level of the charge stored in each memory cell of each flash memory die. The rate of charge loss is also related to the temperature at which the data is stored in the flash memory, and the high temperature will accelerate the increase in the rate of charge loss and make the data retention ability worse. In addition, the high temperature also causes the deterioration of the data retention ability of the flash memory, and reduces the lifetime of the storage system of the flash memory.

Although a temperature sensor can be set near the memory die, the sensed temperature often cannot accurately represent the operation temperature inside the memory die, and the memory system cannot monitor the temperature status in the memory die in real time.

Therefore, there is a need for an architecture and method for sensing an internal temperature of a memory die.

SUMMARY

According to one embodiment of the disclosure, a memory die with temperature sensing function is provided. The memory die may comprise at least one temperature monitoring pin, outputting a temperature status in the memory die; a temperature sensor, arranged in the memory die for sensing an operating temperature in the memory die; and a control logic unit, coupled to the temperature sensor for receiving the operating temperature, and coupled to the at least one temperature monitoring pin. The control logic unit compares the operating temperature with at least one threshold value received from outside of the memory die to generate a comparison result, and outputs the temperature status through the at least one temperature monitoring pin according to the comparison result.

In the above memory die, when the operation temperature is smaller than the at least one threshold value, the temperature status is a normal status, and when the operation temperature is larger than the at least one threshold, the temperature status is an over threshold status.

In the above memory die, the control logic unit, as an example, can further comprise a storage unit, storing the at least one threshold value; and a comparator, having input terminals which are respectively coupled to the storage unit and the temperature sensor, and an output terminal which is coupled to the at least one temperature monitoring pin. The comparator receives the operation temperature and the at least one threshold value respectively from the temperature sensor and the storage device, and compares the operation temperature with the at least one threshold value to generate the comparison result.

In the above memory die, the memory die receives the at least one threshold value after receiving a specific command from the outside, and stores the at least one threshold value in the storage unit.

In the above memory die, a host controller coupled with the memory die monitors a status of the at least one temperature monitoring pin to acquire the temperature status of the memory die in real time.

In the above memory die, during a period when the memory die is powered on, the control logic unit continuously compares the operation temperature with the at least one threshold value.

In the above memory die, the memory die includes at least a memory die used for flash memory, magnetic memory, embedded multimedia card (eMMC), secure digital card (SD), universal flash storage (UFS) or solid-state drive (SSD).

According to another embodiment of the disclosure, a memory with temperature sensing function is provided. The memory, as an example, may comprise at least one memory die; and a host controller, coupled to the at least one memory die for controlling the at least one memory die. The at least one memory die may comprise at least one temperature monitoring pin, outputting a temperature status in the at least one memory die; a temperature sensor, arranged in the at least one memory die for sensing an operation temperature in the at least one memory die; and a control logic unit, coupled to the temperature sensor for receiving the operation temperature, and coupled to the at least one temperature monitoring pin. The control logic unit compares the operation temperature with at least one threshold value received from the host controller to generate a comparison result, and outputs the temperature status to the host controller through the at least one temperature monitoring pin according to the comparison result.

In the above memory, the host controller issues a specific command to the at least one memory die, so as to transmit the at least one threshold value to the at least one memory die.

In the above memory, when the operation temperature is smaller than the at least one threshold value, the temperature status is a normal status, and when the operation temperature is larger than the at least one threshold value, the temperature status is an over threshold status.

In the above memory, the control logic unit, as an example, may further comprise a storage unit, receiving and storing the at least one threshold value from the host controller; and a comparator, having input terminals which are respectively coupled to the storage unit and the temperature sensor, and an output terminal which is coupled to the at least one temperature monitoring pin. The comparator receives the operation temperature and the at least one threshold value respectively from the temperature sensor and the storage device, and compares the operation temperature with the at least one threshold value to generate the comparison result. In the above memory, after the at least one memory die receives the specific command from the host controller, the at least one memory die receives the at least one threshold value from the host controller, and stores the at least one threshold value in the storage unit.

In the above memory, during a period when the memory is powered on, the control logic unit continuously compares the operation temperature with the at least one threshold value, and the host controller continuously monitors a status of the at least one temperature monitoring pin to acquire the temperature status in the at least one memory die in real time.

In the above memory, the at least one memory die includes at least a memory die used for flash memory, magnetic memory, embedded multimedia card (eMMC), secure digital card (SD), universal flash storage (UFS) or solid-state drive (SSD).

According to another embodiment of the disclosure, a method for sensing a temperature status in a memory die is provided, in which a temperature sensor is provided in the memory die to sense an operation temperature in the memory die. The method may comprise: receiving at least one threshold value from outside of the memory die; comparing the operation temperature with the at least one threshold value to generate a comparison result; and outputting the temperature status corresponding to the comparison result to a host controller coupled to the memory die through the at least one temperature monitoring pin of the memory die.

In the above method, when the operation temperature is smaller than the at least one threshold value, the temperature status is a normal status, and when the operation temperature is larger than the at least one threshold value, the temperature status is an over threshold status.

In the above method, the host controller issues a specific command to the memory die to transmit the at least one threshold value to the memory die.

In the above method, after the memory die receives the specific command from the host controller, the memory die receives and stores the at least one threshold value.

In the above method, the host controller continuously monitors a status of the at least one temperature monitoring pin to acquire the temperature status in the memory die in real time.

In the above method, during a period when the memory die is powered on, the operation temperature is continuously compared with the at least one threshold value, and the temperature status corresponding to the comparison result is continuously output to the host controller through the at least one temperature monitoring pin of the memory die.

According to the embodiments of the disclosure, by providing a temperature sensor inside the memory die, the actual operation temperature inside the memory die can be accurately sensed. In addition, by providing the temperature monitoring pin, the host controller of the memory can monitor the operation temperature inside the memory die in real time.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
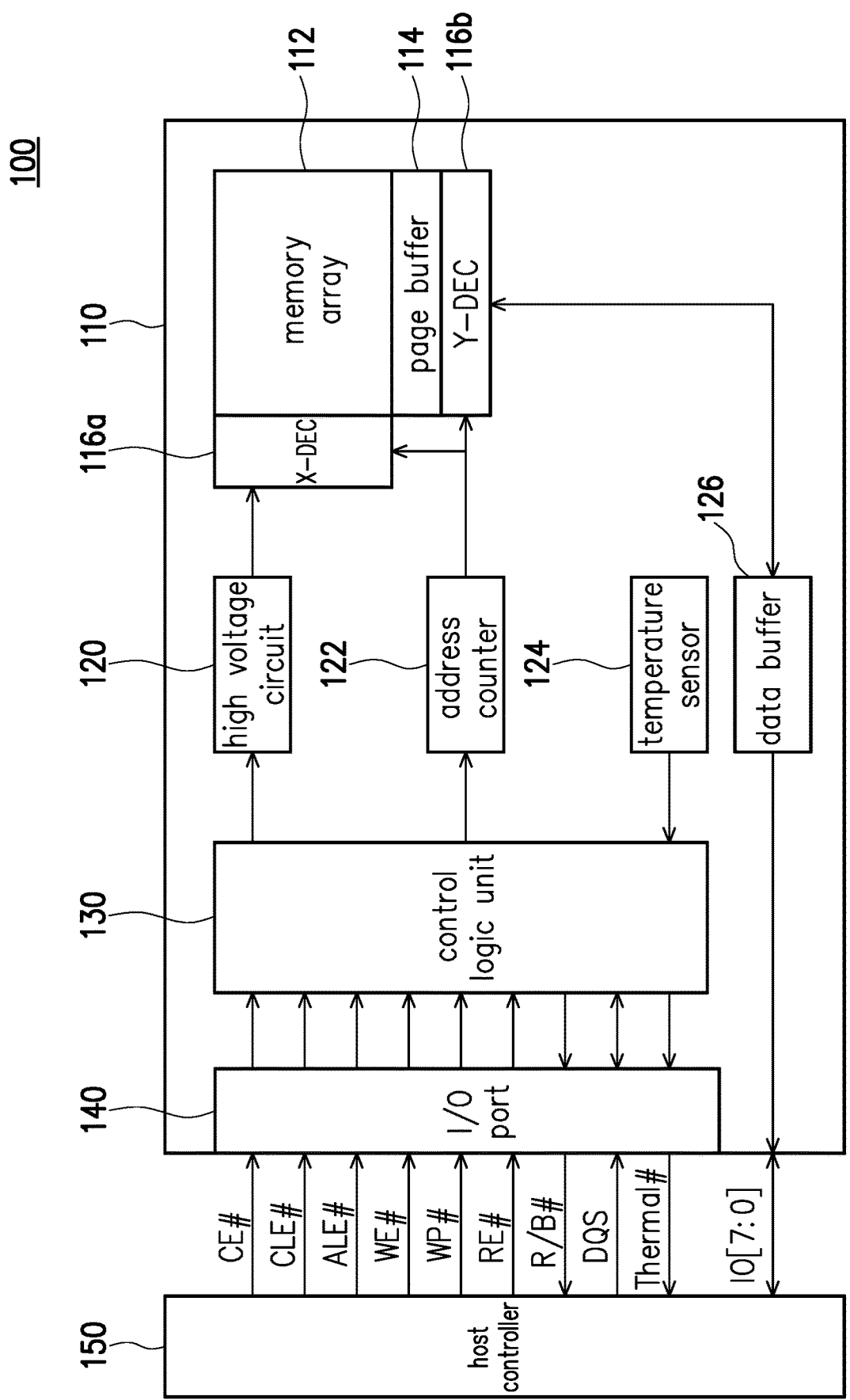
FIG. 1 is a schematic diagram illustrating a configuration of a memory with temperature sensing function according to one embodiment of the disclosure.

FIG. 1 is a schematic diagram illustrating a configuration of a memory with temperature sensing function according to one embodiment of the disclosure. As shown in FIG. 1, the memory 100 of the embodiment comprises at least comprises a memory die 110 and a host controller 150, the host controller 150 is coupled to the memory die 110 for controlling the memory die 110, such as reading, writing, erasing and other existing functions.

In the embodiment, a NAND flash memory die is used as an example for the memory die 110, but the disclosure is not limited thereto, and various memory types can apply the temperature sensing architecture of the present disclosure. As shown in FIG. 1, the memory die 110 comprises basic circuit blocks, such as a control logic unit 130, an input/output (I/O) port 140, a memory array 110, an X-decoder (X-DEC) 116a, a Y-decoder (Y-DEC) 116b, a page buffer 114, a high voltage circuit 120, an address counter 122, and a data buffer 126. The functions and operations of these basic circuit blocks of the memory die 110 are basically the same as or similar to the existing architecture, and the actual architecture does not affect the implementation of the embodiment, so the detailed description is omitted here.

According to the embodiment of the disclosure, as shown in FIG. 1, the memory die 110 further comprises a temperature sensor 124 and a temperature monitoring pin Thermal #. The temperature sensor 124 is arranged in the memory die 110 to sense an operation temperature Td inside the memory die 110. The control logic unit 130 is coupled to the temperature sensor 124 for receiving the operation temperature Td, and comparing the operating temperature Td with a temperature threshold value (hereinafter referred to as the threshold value) Tth, and according to the comparison result, the temperature status in the memory die 110 is output through the temperature monitoring pin Thermal #. The threshold value Tth is written to the memory die 110 from an external host controller 150. In one embodiment, the threshold Tth is written (stored) to the control logic unit 130. According to the embodiment, the memory 100 will provide a specific command for the host controller 150 to acknowledge the memory die 110 that the threshold value Tth is to be set. Then, the memory die 110 receives the threshold value Tth. Here, the specific command can be spare commands provided from the specification of the memory 100. The setting of the threshold value Tth will be described in details below.

In addition, the temperature sensor 124 of the embodiment is arranged in the memory die 110, so that the temperature sensor 124 can accurately sense the actual operation temperature Td inside the memory die 110. Basically, the temperature sensor 124 may be formed by any known semiconductor process. The temperature sensor 124 can be formed in the memory die 110 together with the formation of the memory die 110, so that the memory die 110 can be manufactured at the same time. form. In addition, as long as the temperature sensor 124 can sense the operation temperature Td inside the memory die 110, the types of the temperature sensor 124 is not particularly limited. In addition, the position for forming the temperature sensor 124 is not particularly limited, as long as the temperature sensor 124 can easily and accurately sense the operation temperature Td in the memory die 110.

As shown in FIG. 1, the temperature monitoring pin Thermal # can be coupled to the control logic unit 130 through the IO port 140, and also coupled to the host controller 150. The temperature monitoring pin Thermal # can be a spare pin (unused) of the memory die 110, or a pin that is additionally provided for the memory die 110. The embodiment does not particularly limit the form of the temperature monitoring pin Thermal #. According to the embodiment, as mentioned above, the control logic unit 130 compares the operation temperature Td with the threshold value Tth and outputs the temperature status through the temperature monitoring pin Thermal #. In this way, the host controller 150 can monitor the status of the temperature monitoring pin Thermal # at any time, and acquire in real time whether the temperature inside the memory die 110 exceeds the threshold value Tth.

In one embodiment, when the operation temperature Td is smaller than the threshold value Tth, the control logic unit 130 can determine that the temperature status inside the memory die 110 is a "normal status", the temperature monitoring pin Thermal #maintains the high level (H) status, for example. When the operation temperature Td is larger than the threshold value Tth, the control logic unit 130 can determine that the inside of the memory die 110 is a high temperature status, and the temperature status is defined as "over threshold status". The status of the monitoring temperature monitoring pin Thermal # will be transient from the high level (H) status to the low level (L) status. In this way, the host controller 150 can immediately acquire the temperature status in the memory die 110 by monitoring the output status of the temperature monitoring pin Thermal #.

Figure 2:
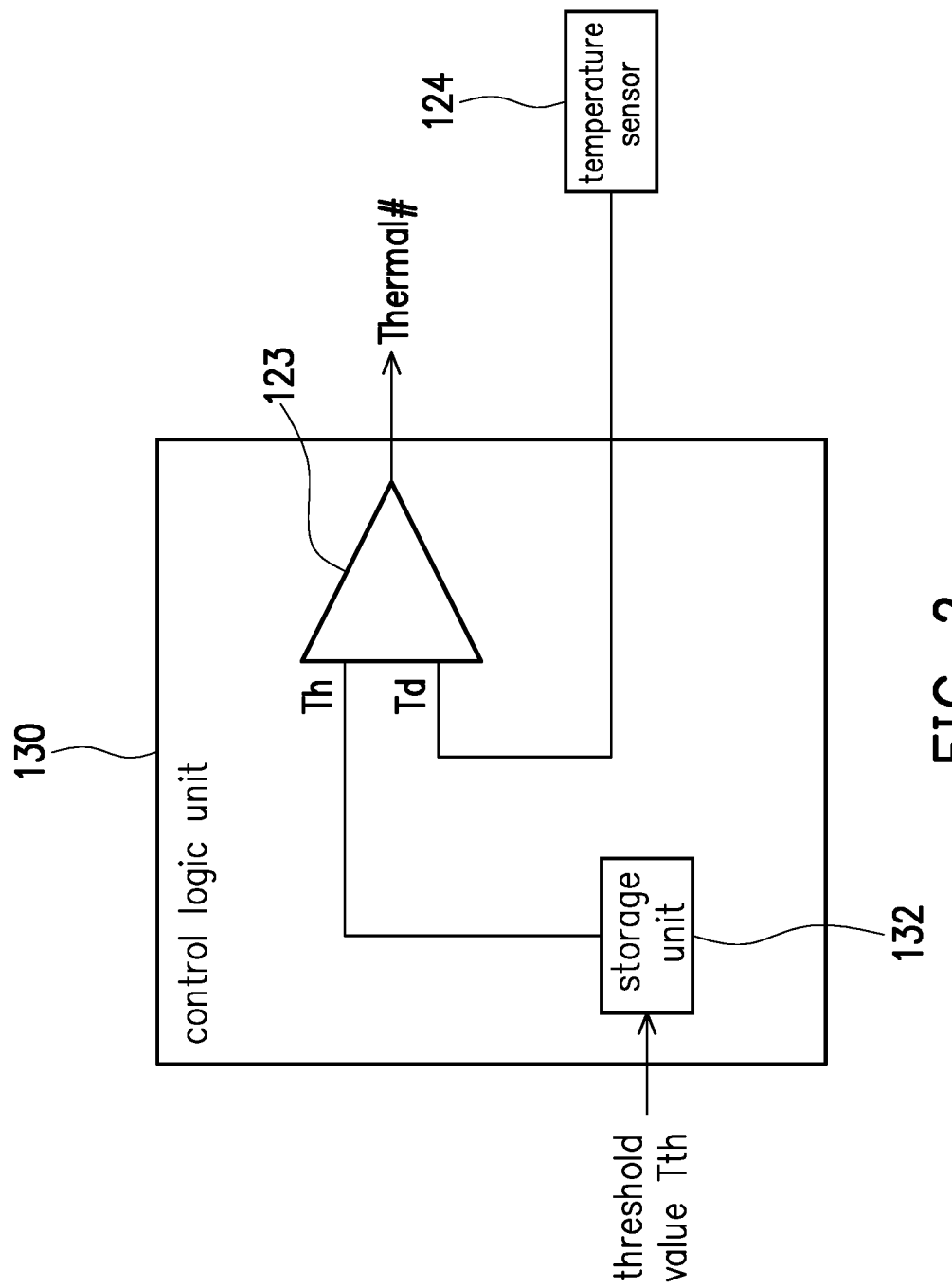
FIG. 2 shows a schematic circuit diagram of the control logic unit in FIG. 1 according to one embodiment of the disclosure.

FIG. 2 shows a schematic circuit diagram of the control logic unit in FIG. 1 according to one embodiment of the disclosure. In FIG. 2, only circuit components related to this embodiment are illustrated as an example of the control logic unit 130, and other circuit components not shown in the control logic unit 130 are basically similar or the same as the existing control logic unit, so illustration and description for the common components are omitted. As shown in FIG. 2, the control logic unit 130 at least comprises a storage unit 132 and a comparator 134. The storage unit 132 is used to receive and store the threshold value Tth from the outside of the memory die 110, i.e., from the host controller 150. The storage unit 132 can use, for example, a register or any configuration that can provide a storage function, and the embodiment is not particularly limited. In addition, as a variation, although not shown, the threshold vale Tth received by the memory die 110 from the outside can also be stored in a memory such as RAM, and then the control logic unit 130 reads the threshold value Tth from the RAM memory and compares the sensed operation temperature Td and the threshold value Tth.

The comparator 134 has input terminals, which are respectively coupled to the dies storage unit 132 and the temperature sensor 124. The comparator 134 also has an output terminal, which is coupled to the temperature monitoring pin Thermal #. Under the configuration, the comparator 134 can receive the threshold value Tth stored in the storage unit 132 and the operation temperature Td in the memory die 110 sensed by the temperature sensor 124, and the operation temperature Td is compared with the threshold value Tth to generate a comparison result. The control logic unit 130 can output a high level (H) status or a low level (L) status on the temperature monitoring pin Thermal # according to the comparison result, so that the host controller 150 can monitor the temperature status inside the memory die 110 in real time.

Figure 3:
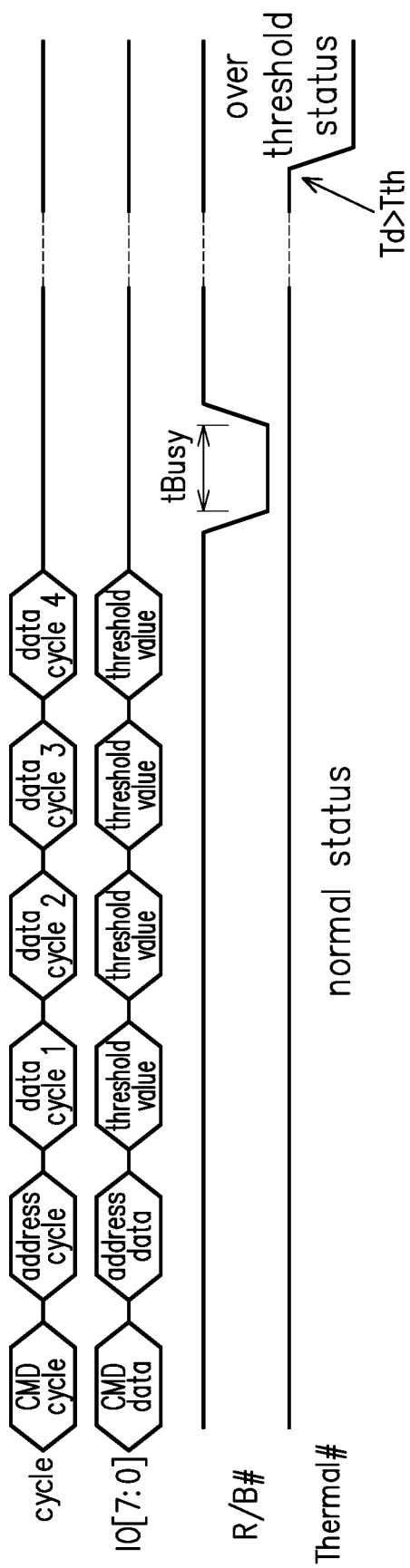
FIG. 3 is a schematic timing chart for setting threshold value according to one embodiment of the disclosure.

FIG. 3 is a schematic timing chart for setting threshold value according to one embodiment of the disclosure. Referring to FIGS. 1 and 3, in this embodiment, the memory 100 will provide a specific command to acknowledge the memory die 110 of the threshold value Tth for the temperature being to be set. First, in the command (CMD) cycle, the host controller 150 will issue a specific command (such as 80h) to the memory die 110 through the IO bus IO [7:0]. The memory die 110 is notified that the threshold value Tth is about to be set upon receiving the specific command. Then, during the address cycle, the host controller 150 will send the address data to the memory die 110 through the IO bus IO [7:0] to inform the memory die 110 of which address of the storage unit 132 (see FIG. 2) the threshold value Tth is to be written to.

Then, the memory die 110 is ready to wait for the host controller 150 to transmit the threshold value Tth. Then, in data cycles 1 to 4, the host controller 150 writes the threshold vale Tth into the memory die 110 through the IO bus IO [7:0]. In this embodiment, the threshold value Tth is written into the storage unit 132 of the control logic unit 130 of the memory die 110. During this process, the R/B #signal line (Ready/Busy #signal line) will be transient to a low level for a period of time tBusy, indicating that the threshold value Tth is being written into the storage unit 132 of the control logic unit 130. When the R/B #signal line is transient to a high level again, the memory die 110 has finished writing and the threshold value Tth is set.

After that, the host controller 150 monitors the temperature monitoring pin Thermal # in real time. When the operation temperature Td in the memory die 110 is smaller than the threshold value Tth, the temperature monitoring pin Thermal #always presents the high level (H) status. At this time, the host controller 150 can immediately acquire that the operation temperature Td of the memory die 110 is at the normal status by monitoring the temperature monitoring pin Thermal # in real time. Conversely, when the operation temperature Td is larger than the threshold value Tth, the status of the temperature monitoring pin Thermal # is transient from the high level (H) status to the low level (L) status. In this way, the host controller 150 can acquire that the operation temperature Td in the memory die 110 is at the over threshold status by monitoring the temperature monitoring pin Thermal # in real time.

Figure 4:
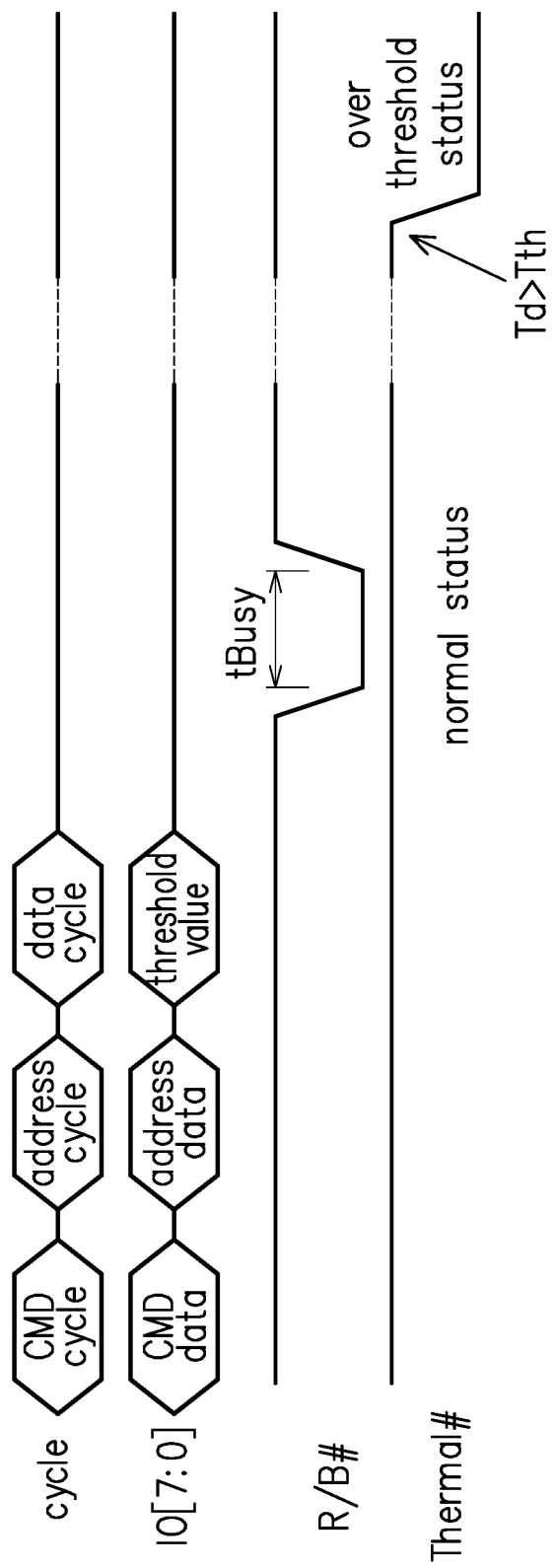
FIG. 4 is a schematic timing chart for setting the threshold value according to one embodiment of the disclosure.

FIG. 4 is a schematic timing chart for setting the threshold value according to one embodiment of the disclosure. The difference between FIG. 4 and FIG. 3 is that the embodiment shown in FIG. 4 writes the threshold value Tth to the memory die 110 through the IO bus IO [7:0] in one data cycle. Therefore, the number of data cycles required to write the threshold value Tth can be determined according to requirements.

Figure 5:
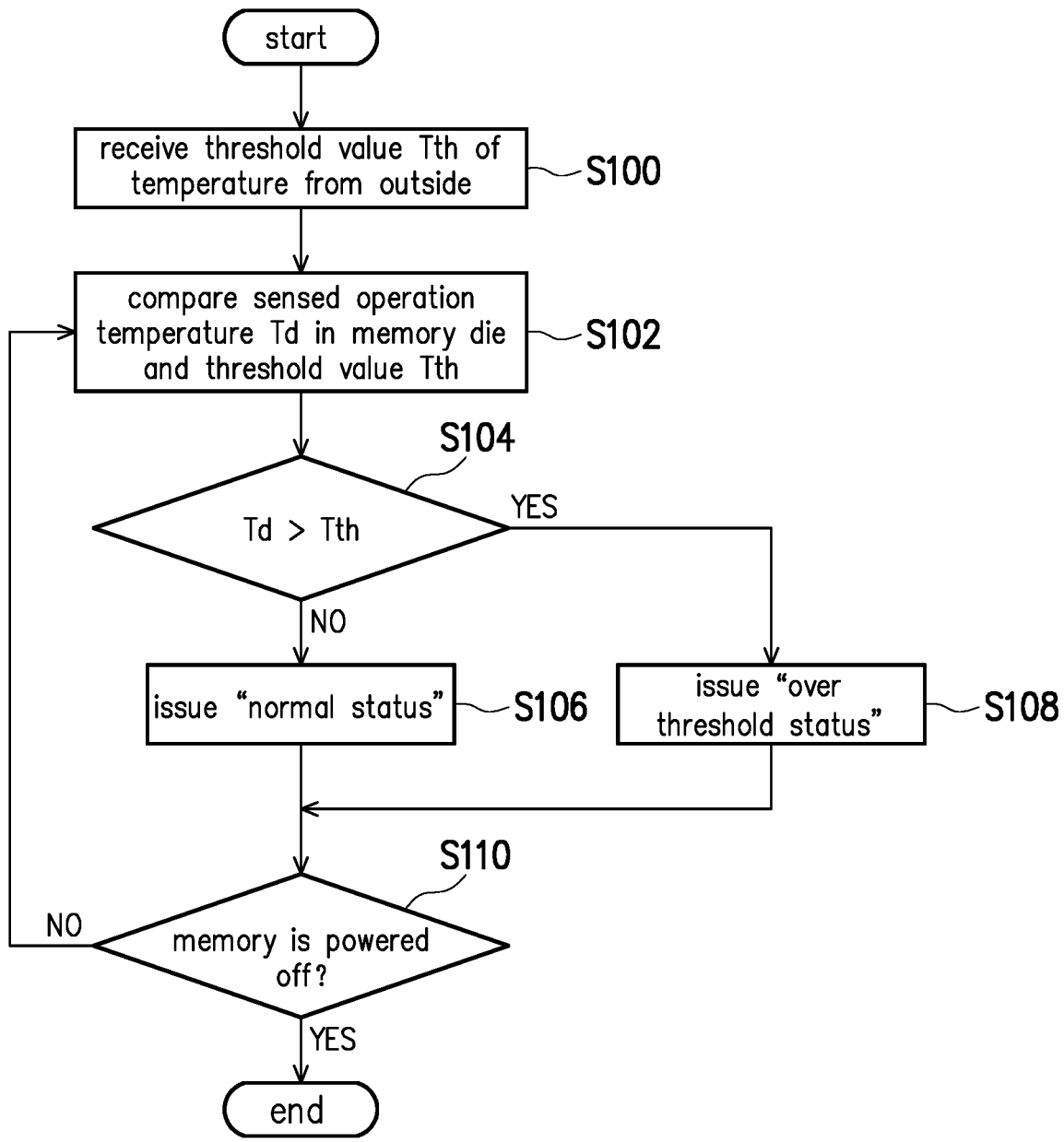
FIG. 5 is a schematic flow chart for sensing a temperature of the memory die according to the present embodiment.

FIG. 5 is a schematic flow chart for sensing a temperature status of the memory die according to the embodiment. In this embodiment, a temperature sensor 124 is provided inside the memory die 110 as described above (see FIG. 1). First, referring to FIGS. 1 and 5, in step S100, the memory die 110 receives the temperature threshold value Tth from the outside. The threshold value Tth is set by the host controller 150.

Figure 6A:
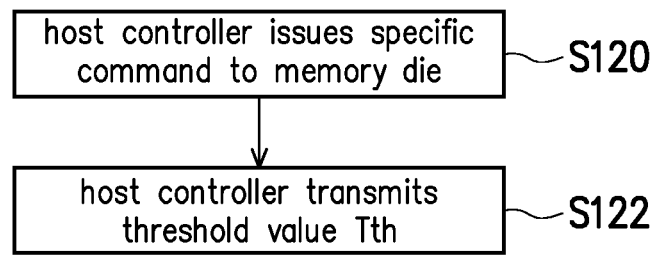
FIG. 6A is a schematic flow chart for setting the threshold value to the memory die by the host controller.

FIG. 6A is a schematic flow chart for setting the threshold value to the memory die by the host controller. As shown in FIGS. 1 and 6A, in step S120, the host controller 150 issues a specific command to the memory die. Namely, the host controller 150 acknowledges the memory die 110 of the threshold value Tth being to be set, that is, as shown in FIG. 3 or FIG. 4, the specific command is transmitted to the memory die 110 in the command cycle, and the address data is then transmitted to the memory die 110 in the address cycle. Next, in step S112, the host controller 150 transmits the threshold value Tth, that is, as shown in FIG. 3 or FIG. 4, the threshold value Tth is transmitted to the memory die 110 during the data cycle(s).

Figure 6B:
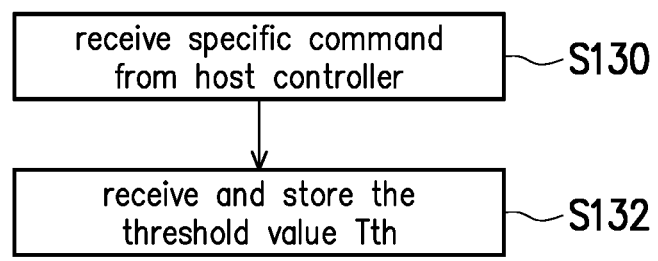
FIG. 6B is a schematic flow chart for writing the threshold value to the memory die.

F FIG. 6B is a schematic flow chart for writing the threshold value to the memory die. On the contrary, the processing flow on the side of the memory die 110 is shown in FIG. 6B. In step S130, the memory die 110 receives the specific command issued from the host controller 150, that is, the memory die 110 is informed that the host controller 150 is about to transmit the threshold value Tth to the memory die 110. Next, in step S132, the memory die 110 receives and stores the threshold value Tth. As an example, according to FIG. 3 or FIG. 4, based on the address data received in the address cycle, the memory die 110 stores the threshold vale Tth in the storage unit 132 of the control logic unit 130 (see FIG. 2).

During the process of the method, the temperature sensor 124 provided in the memory die 110 continuously senses the operation temperature Td inside the memory die 110. Next, as shown in FIG. 5, in step S102, the sensed operation temperature Td in the memory die 110 is compared with the threshold value Tth. For example, the comparator 134 of the control logic unit 130 shown in FIG. 2 can be used to compare the operation temperature Td with the threshold value Tth.

Next, in step S104, whether the operation temperature Td is larger than the threshold value Tth is determined. This determination can be made according to the output of the comparator 134, for example. The comparator 134 can output the high level (H) or the low level (L) according to the comparison result. That is, the control logic unit 130 can output the temperature status inside the memory die 110 based on the received operation temperature Td and the threshold value Tth.

In step S106, when the operation temperature Td is smaller than the threshold value Tth, that is, the determination result of step S104 is "No", the memory die 110 will issue a signal (i.e., H status) indicating the "normal status" through the temperature monitoring pin Thermal # to the host controller 150. That is, when the operation temperature Td is smaller than the threshold value Tth, the comparator 134 can output the high (H) status for example, and the temperature status corresponding to the comparison result (the high (H) status), i.e., the "normal status", is output through the temperature monitoring pin Thermal #. At this time, because the host controller 150 can monitor in real time the status of the temperature monitoring pin Thermal #, the host controller 150 can determine in real time that the temperature status in the memory of the memory die 110 is in the "normal status". Then, the process proceeds to step S110 to determine whether the memory 100 is power off or not.

In step S108, when the operation temperature Td is larger than the threshold value Tth, that is, the determination result of step S104 is "Yes", the memory die 110 will issue a signal (i.e., L status) indicating the "over through status" to the host controller 150. That is, when the operation temperature Td is larger than the threshold value Tth, the comparator 134 can output the low (L) status for example, and the temperature status corresponding to the comparison result (the low status), the "over threshold status", is output through the temperature monitoring pin Thermal #. At this time, because the host controller 150 can monitor in real time the status of the temperature monitoring pin Thermal #, that is, the host controller 150 can determine in real time that the temperature status in the memory die 110 is in the "over threshold status". After that, the process proceeds to step S110 to determine whether the memory 100 is powered off or not.

In step S110, if the memory 100 is continuously powered, that is, the determination result is "Yes", it means that the memory 100 is still in operation, and the operation temperature Td in the memory die 110 needs to be continuously monitored, then the process returns to step S102, and the process from step S102 to step S110 is repeated. In contrast, if the determination result in step S110 is "No", it means that the operation of the memory 100 has stopped and there is no need to monitor the operation temperature Td in the memory die 110.

In addition, the memory configuration of the above embodiment uses the flash memory (such as a NAND flash memory) as an example of the memory die 110. However, the disclosure is not limited thereto, any type of memory (or main controller) can use the technical means of the disclosure to sense the temperature inside the memory die. For example, the memory die 110 may at least include but is not limited to flash memory, magnetic memory, embedded multimedia card (eMMC), secure digital memory card (SD card), universal flash storage (UFS) or solid-state drive (SSD), etc.

In the above description, one temperature monitoring pin Thermal # and a threshold value Tth are provided in the memory die 110 as an example. However, in the embodiment, multiple temperature monitoring pins Thermal #(1~n) and multiple threshold values Tth1~Tthn can also be provided. Take two temperature monitoring pins Thermal #1, Thermal #2 and two threshold values Tth1 and Tth2 as an example, the host controller 150 can monitor the high level status and low level status of the temperature monitoring pins Thermal #1 and Thermal #2 to obtain the relationship between the operation temperature Td and the threshold values Tth1 and Tth2 (assuming Tth2>Tth1). For example, the temperature monitoring pin Thermal #1 is in the high level status, and the temperature monitoring pin Thermal #2 is in the low level status. It can be known that the current operation temperature Td in the memory die 110 is larger than the threshold value Tth1 but smaller than the threshold value Tth2. Therefore, in this example, there are three statuses, namely Td<Tth1, Th1<Td<Tth2, Td>Tth2. Therefore, the embodiment of the disclosure can further set a plurality of temperature monitoring pins Thermal # and a plurality of threshold values Tth according to requirements, so as to define more temperature statuses.

In summary, according to the embodiment of the disclosure, by providing the temperature sensor 124 inside the memory die 110, the actual operation temperature Td inside the memory die 110 can be accurately sensed. Compared with that the temperature sensor is arranged outside the memory die, the embodiment of the disclosure can reflect the operation temperature Td more faithfully.

In addition, according to this embodiment, by providing the temperature monitoring pin, the host controller 150 of the memory 100 can monitor the operation temperature Td inside the memory die 110 in real time. In addition, the host controller can use the specific command described above to sets the threshold temperature Tth, which is used as a reference for determining the status of the operation temperature Td of the memory die 110, to the memory die 110. Therefore, through the technical means of the embodiments of the disclosure, the temperature sensor 124 can automatically and continuously sense the operation temperature Td inside the memory die in real time, and the sensed operation temperature Td can be compared with the threshold value Tth in real time. Furthermore, by continuously monitoring the temperature monitoring pins, the host controller 150 can grasp the temperature status inside the memory die 110 in real time and accurately.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory die with temperature sensing function, wherein the memory die is coupled to a host controller outside the memory die, the memory die comprising:
   a memory array;
   at least one temperature monitoring pin, provided on and outside the memory die and configured to output a temperature status in the memory die;
   a temperature sensor, arranged in the memory die for sensing an operation temperature in the memory die; and
   a control logic unit, coupled to the memory array and the temperature sensor, wherein the control logic unit is configured to receive the operation temperature and receive a specific command from the host controller, and coupled to the at least one temperature monitoring pin, wherein the specific command comprises at least one threshold value,
   wherein the control logic unit is configured to compare the operation temperature with the at least one threshold value to generate a comparison result, and is configured to output the temperature status through the at least one temperature monitoring pin to the host controller according to the comparison result.

2. The memory die according to claim 1, wherein when the operation temperature is smaller than the at least one threshold value, the temperature status is a normal status, and when the operation temperature is larger than the at least one threshold, the temperature status is an over threshold status.

3. The memory die according to claim 1, wherein the control logic unit further comprises:
   a storage unit, configured to store the at least one threshold value; and
   a comparator, having input terminals which are respectively coupled to the storage unit and the temperature sensor, and an output terminal which is coupled to the at least one temperature monitoring pin,
   the comparator is configured to receive the operation temperature and the at least one threshold value respectively from the temperature sensor and the storage device, and configured to compare the operation temperature with the at least one threshold value to generate the comparison result.

4. The memory die according to claim 3, wherein in the data cycle, the memory die is configured to receive the at least one threshold value after receiving the specific command, and configured to store the at least one threshold value in the storage unit.

5. The memory die according to claim 1, wherein the host controller is configured to monitor a status of the at least one temperature monitoring pin to acquire the temperature status of the memory die in real time.

6. The memory die according to claim 1, wherein during a period when the memory die is powered on, the control logic unit is configured to continuously compare the operation temperature with the at least one threshold value.

7. The memory die according to claim 1, the memory die includes at least a memory die used for flash memory, magnetic memory, embedded multimedia card (eMMC), secure digital card (SD), universal flash storage (UFS) or solid-state drive (SSD).

8. A memory with temperature sensing function, comprising:
   at least one memory die; and
   a host controller, provided outside the at least one memory die and coupled to the at least one memory die for controlling the at least one memory die,
   wherein the at least one memory die comprises:
   a memory array;
   at least one temperature monitoring pin, provided on and outside the memory die and configured to output a temperature status in the at least one memory die;
   a temperature sensor, arranged in the at least one memory die for sensing an operation temperature in the at least one memory die; and
      a control logic unit, coupled to the memory array and the temperature sensor, wherein the control logic unit is configured to receive the operation temperature and receive a specific command from the host controller, and coupled to the at least one temperature monitoring pin, wherein the specific command comprises at least one threshold value,
   the control logic unit is configured to compare the operation temperature with the at least one threshold value to generate a comparison result, and is configured to output the temperature status to the host controller through the at least one temperature monitoring pin according to the comparison result.

9. The memory according to claim 8, wherein when the operation temperature is smaller than the at least one threshold value, the temperature status is a normal status, and when the operation temperature is larger than the at least one threshold value, the temperature status is an over threshold status.

10. The memory according to claim 8 wherein the control logic unit further comprises:
    a storage unit, configured to receive and store the at least one threshold value sent from the host controller; and
    a comparator, having input terminals which are respectively coupled to the storage unit and the temperature sensor, and an output terminal which is coupled to the at least one temperature monitoring pin,
    the comparator is configured to receive the operation temperature and the at least one threshold value respectively from the temperature sensor and the storage device, and configured to compare the operation temperature with the at least one threshold value to generate the comparison result.

11. The memory according to claim 10, wherein in the data cycle, after the at least one memory die is configured to receive the specific command from the host controller, and configured to store the at least one threshold value in the storage unit.

12. The memory with temperature sensing function as described in claim 8, during a period when the memory is powered on, the control logic unit is configured to continuously compare the operation temperature with the at least one threshold value, and the host controller is continuously configured to monitor a status of the at least one temperature monitoring pin to acquire the temperature status in the at least one memory die in real time.

13. The memory according to claim 8, the at least one memory die includes at least a memory die used for flash memory, magnetic memory, embedded multimedia card (eMMC), secure digital card (SD), universal flash storage (UFS) or solid-state drive (SSD).

14. A method for sensing a temperature status in a memory die with at least one temperature monitoring pin that is provided on and outside the memory die, a temperature sensor being provided in the memory die to sense an operation temperature in the memory die, and the method comprising:
   receiving a specific command from outside of the memory die, wherein the specific command comprises at lase one threshold value;
   comparing the operation temperature with the at least one threshold value to generate a comparison result; and
   outputting the temperature status corresponding to the comparison result to a host controller coupled to and outside of the memory die through the at least one temperature monitoring pin of the memory die.

15. The method according to claim 14, wherein when the operation temperature is smaller than the at least one threshold value, the temperature status is a normal status, and when the operation temperature is larger than the at least one threshold value, the temperature status is an over threshold status.

16. The method according to claim 15, wherein in the data cycle, after the memory die is configured to receive the specific command from the host controller, the memory die is configured to receive and store the at least one threshold value.

17. The method according to claim 14, wherein the host controller is configured to continuously monitor a status of the at least one temperature monitoring pin to acquire the temperature status in the memory die in real time.

18. The method according to claim 14, wherein during a period when the memory die is powered on, the operation temperature is continuously compared with the at least one threshold value, and the temperature status corresponding to the comparison result is continuously output to the host controller through the at least one temperature monitoring pin of the memory die.

19. A host controller for controlling a memory die, wherein at least one temperature monitoring pin is provided on and outside the memory die, and the host controller is outside of the memory die, the host controller is configured to
   issue a specific command to the memory die in a command cycle;
   receive a ready status from the memory die after the specific command is received by the memory die, wherein the ready status indicates that the memory die for reception from the host controller;
   send at least one threshold value to the memory die in a data cycle subsequent to the command cycle; and
   receive a temperature status through the at least one temperature monitoring pin from the memory die, wherein the temperature status corresponds to a comparison result between the at least one threshold value and an operation temperature of the memory die, and the comparison result is generated by a control logic unit of the memory die.

20. The host controller according to claim 19, wherein when the operation temperature is smaller than the at least one threshold value, the temperature status is a normal status, and when the operation temperature is larger than the at least one threshold, the temperature status is an over threshold status.

21. The host controller according to claim 19, wherein in the data cycle, the memory die is configured to receive the at least one threshold value after receiving the specific command from the outside, and configured to store the at least one threshold value in the storage unit.

22. The host controller according to claim 19, wherein the host controller is configured to monitor a status of the at least one temperature monitoring pin to acquire the temperature status of the memory die in real time.

23. The host controller according to claim 19, wherein during a period when the memory die is powered on, the control logic unit continuously compares the operation temperature with the at least one threshold value.

\* \* \* \* \*